United States Patent
Grimes et al.

(10) Patent No.: US 11,482,631 B2
(45) Date of Patent: Oct. 25, 2022

(54) BROADBAND EXCITON SCAVENGER DEVICE

(71) Applicant: Plain Sight Innovations LLC, Milton, GA (US)

(72) Inventors: Craig A Grimes, Raleigh, NC (US); Kevin Kreisler, Miami, FL (US)

(73) Assignee: Comstock IP Holdings LLC, Milton, GA (US)

( * ) Notice: Subject to any disclaimer, the term of this patent is extended or adjusted under 35 U.S.C. 154(b) by 475 days.

(21) Appl. No.: 16/445,335

(22) Filed: Jun. 19, 2019

(65) Prior Publication Data

US 2020/0335647 A1  Oct. 22, 2020

Related U.S. Application Data

(60) Provisional application No. 62/686,815, filed on Jun. 19, 2018.

(51) Int. Cl.
  *H01L 31/0352* (2006.01)

(52) U.S. Cl.
  CPC ......... *H01L 31/035218* (2013.01); *H01L 31/035227* (2013.01)

(58) Field of Classification Search
  CPC ..... H01L 31/035218; H01L 31/035227; H01L 31/055; H01L 51/426; H01L 29/12; H01L 29/0676; H01L 29/0669–068; H01L 29/0665; H01L 2924/13061; H01L 29/66439; H01L 29/66469; H01L 29/78687; H01L 29/78696; Y02E 10/52; C07C 1/12; C07C 2523/10; B82Y 30/00; B82Y 40/00; B82Y 20/00; Y10S 977/938
  USPC .......................................................... 257/9
  See application file for complete search history.

(56) References Cited

U.S. PATENT DOCUMENTS

| | | | | |
|---|---|---|---|---|
| 2013/0266809 A1* | 10/2013 | Nueraji | ................... | B01J 23/60 423/594.1 |
| 2014/0076404 A1* | 3/2014 | Tan | ...................... | B08B 7/0035 204/157.52 |
| 2014/0196658 A1* | 7/2014 | Grimes | ................... | C30B 7/10 117/7 |
| 2015/0136229 A1* | 5/2015 | Suto | ..................... | H01L 31/055 136/257 |
| 2019/0341217 A1* | 11/2019 | Nojeh | ..................... | H01J 33/04 |

OTHER PUBLICATIONS

Liu et al. ('Simulated-sunlight-activated photocatalysis of Methylene Blue using cerium-doped SiO2/TiO2 nanostructured fibers', Journal of Environmental Sciences 2012, 24(10) 1867-1875). (Year: 2012).*

* cited by examiner

*Primary Examiner* — Mohammad M Hoque
(74) *Attorney, Agent, or Firm* — Dunlap Codding, P.C.

(57) ABSTRACT

The present invention relates to the design and fabrication of a device able to efficiently convert broad-spectrum, microwave to X-ray, electromagnetic energy into electricity. Exciton Scavenger fabrication requires intercalation of rare earth ion containing crystallites, quantum-dots, or nanoparticles within a one-dimensional semiconducting material nanoarchitecture, such as arrays of nanowires or nanotubes.

18 Claims, 1 Drawing Sheet

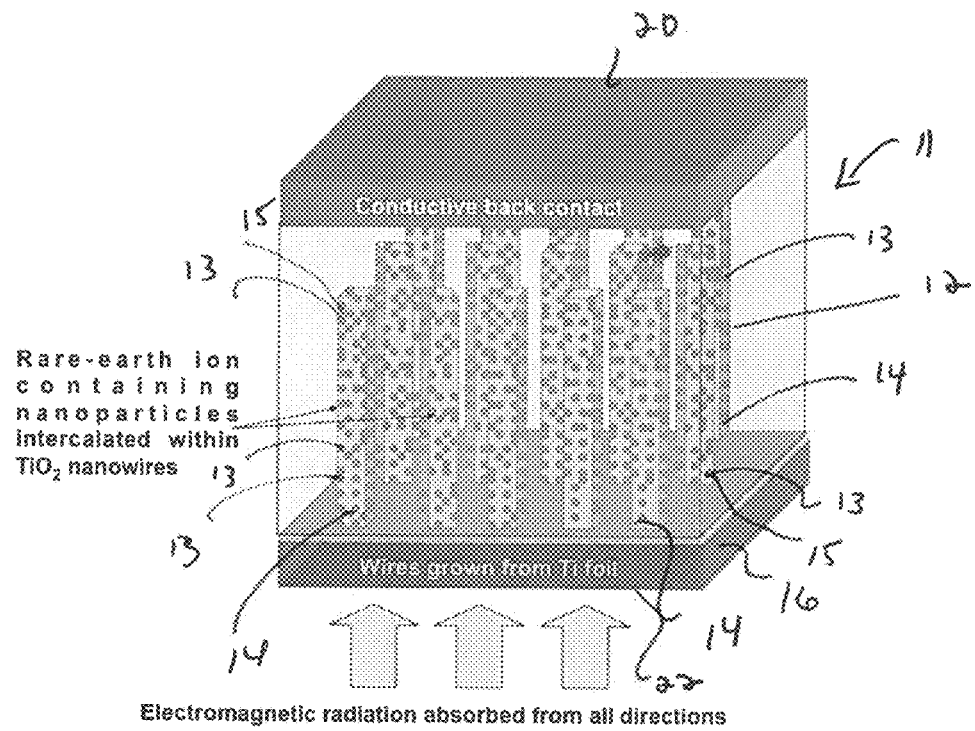
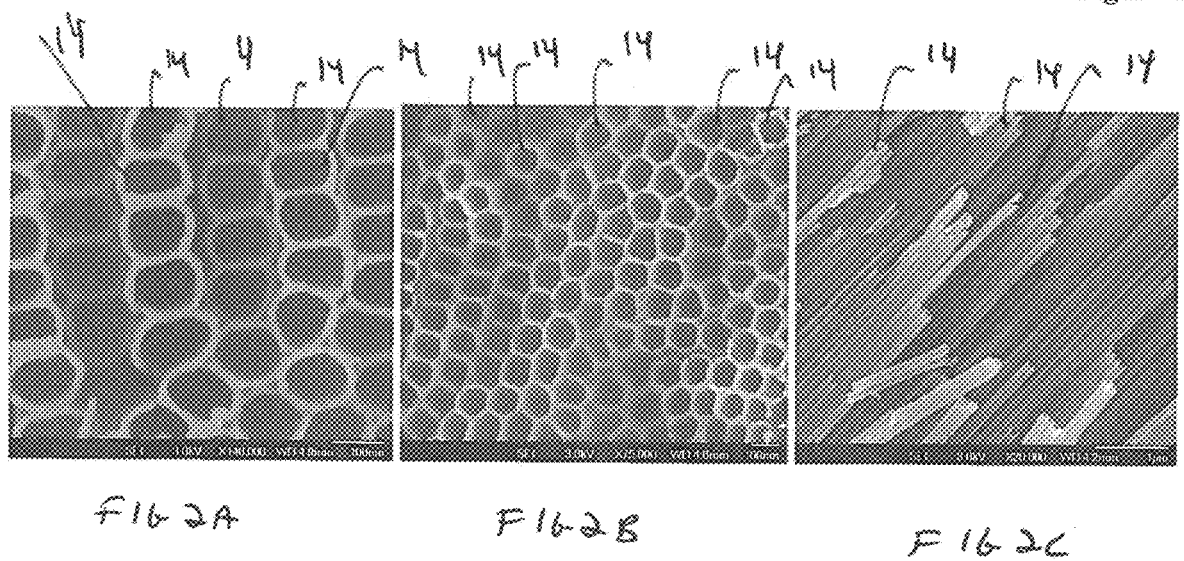
Figure 1
FIG 2A  FIG 2B  FIG 2C

BROADBAND EXCITON SCAVENGER DEVICE

FIELD OF THE INVENTION

The present invention relates to an exciton scavenger device able to convert ambient radiation into electricity.

BACKGROUND OF THE INVENTION

Rare-earth elements, the fifteen lanthanides as well as scandium and yttrium, are known to broadly absorb electromagnetic radiation due to their unique electron orbital structure; notably, the filled $5p^6 6s^2$ orbitals overlap with the 4f orbital. Bound within an electrically insulating 'cage', either organic host matrices such as organic ligands bearing aromatic chromophores, or inorganic host matrices such as halides, oxides, oxyhalides, or oxysulfides, rare earth metal ions are known to demonstrate up-conversion (UC) properties, wherein two or more low energy photons are absorbed with the emission of a high-energy photon, as well as down-conversion (DC) properties with absorption of a high energy photon resulting in emission of one or more low energy photons. J. Wang, N. He, Y. Zhu, Z. An, P. Chen, C. A. Grimes, Z. Nie, Q. Y. Cai, *Highly-luminescent Eu,Sm, Mn-doped CaS Up/Down conversion Nanoparticles: Application to Ultra-Sensitive Latent Fingerprint Detection and in vivo Bioimaging*, Chemical Communications 54 (2018) 591-594] report up conversion efficiencies of over 59%.

Due to their over-lapping electron orbitals rare earth containing compounds are known to absorb broad-spectrum electromagnetic radiation, in turn generating excitons that, in bulk samples, immediately return all energy to the atomic lattice in the form of phonon vibrations. However, if the rare earth ions are bound within an electrically insulating organic or inorganic framework, these radiation generated excitons recombine over a period of up to several hours emitting light at wavelengths dependent upon the composition and structure of the rare earth containing compound; it is for these properties that rare-earth containing compounds are used, for example, in road signs or emergency signage.

The nonlinear behavior is a consequence of the radiation-generated excitons within the rare earth ions being 'trapped' about the ion by an electrically insulating shell and, having no immediate pathway for travel, instead undergo various time-dependent probabilistic atomic energy-level transitions. As a consequence of these luminescent UC/DC properties such materials are of interest for use as thermoluminescence dosimeters and high-energy radiation detectors, and since the up/down converted photons can be emitted up to several hours after energy absorption in applications requiring luminescent fluorescence such as emergency signage.

It is known that both UC and DC properties are strongly dependent upon the host material and binding material, that is the selection of doped active ions and electrically insulating shell, for example a fluoride or an oxide, with emissive properties largely determined by the degree to which excited states are populated and non-radiative de-activation paths minimized.

It is known that while excitons of short lifetime, such as those manifest in conventional semiconductor-based devices where photogenerated charge lifetimes are typically on the order of picoseconds, are difficult to collect, it is significantly easier to collect excitons possessing extended lifetimes, and it is understood that collected excitons can be made to do useful work.

The exciton lifetimes of the rare earth nanocrystals are of unprecedented duration. For example, it is described in Y. Yang, P. Zhou, W. Xu, S. Xu, Y. Jiang, X. Chen, H. Song, *$NaYF_4:Yb^{3+}$, $Tm^{3+}$ inverse opal photonic crystals and $NaYF_4:Yb^{3+}$, $Tm^{3+}/TiO_2$ composites: synthesis, highly improved upconversion properties and NIR photoelectric response*, J. Materials Chemistry C 4 (2016) 659-662 that exciton lifetimes of various electron-orbital transitions seen in $NaYF_4:Yb^{3+}$, $Tm^{3+}$ nanocrystals under near-IR (NIR) illumination at room temperature ($\approx$300 K) with lifetimes of 299 µs to 1.21 ms depending upon the energy transition and in D. Li, Z. Huang, Z. Nie, L. Zhang, Y. Bai, X. Zhang, Y. Song, Y. Wang, *Anomalous upconversion luminescence of $SrMoO_4:Yb^{3+}/Er^{3+}$ nanocrystals by high excited state energy transfer*, J. Alloys and Compounds 650 (2015) 799-804, examining UC properties of $SrMoO_4:Yb^{3+}/Er^{3+}$ nanocrystals under 976 nm illumination, report room-temperature exciton lifetimes generally well above 1 ms.

For comparison, these values are some 1000 to 10,000 times longer than the (77 K, liquid nitrogen) charge lifetimes measured for IR-responsive InAs/InAsSb semiconducting pn-junction superlattices [E. H. Steenbergen, B. C. Connelly, G. D. Metcalfe, H. Shen, M. Wraback, D. Lubyshev, Y. Qiu, J. M. Fastenau, A. W. K. Liu, S. Elhamari, O. O. Cellek, and Y. H. Zhang. *Significantly improved minority carrier lifetime observed in long-wavelength infrared III-V type-II superlattice comprised of InAs/InAs Sb*. Appl. Phys. Letters 99 (2011), 251110] grown by molecular beam epitaxy; as is well known, at room temperature charge carrier lifetimes of conventional semiconductor devices are so short as to preclude but niche applications.

The underlying luminescence mechanism(s) of rare earth containing compounds are described in J. Wang, J. H. Hao, P. A. Tanner, *Upconversion luminescence of an insulator involving a band to band multiphoton excitation process*, Opt. Express 19 (2011) 11753-11758], examining the UC properties of lanthanide oxide compounds, $Yb_2O_3$, $Ce_2O_3$, and $Tm_2O_3$, attribute the UC emissions to thermal avalanche. Alternatively, it is suggested in T. Aitasalo, J. Holsa, H. Junger, M. Lastusaari, J. Niittykoski, *Mechanisms of persistent luminescence in $Eu^{2+}$, $RE^{3+}$ doped alkaline earth aluminates*, J. Luminescence 94-95 (2001) 59-63 that the broadband emissions are due to thermal bleaching of excitons trapped in a meta-stable state. In contrast, J. Zheng, X. F. Wang, W. Y. He, Y. Y. Bu, X. H. Yan, *Seven-photon ultraviolet upconversion emission of $Er^{3+}$ induced by 1,540 nm laser excitation*, Applied Phys. B 115 (2014) 443-449], consider the UC/DC process to be due to multi-photon cascades. Others suggest, for example, super-saturation of the intermediate states of the rare-earth ions.

However, regardless of what the underlying mechanism precisely is, it is known that the radiation generated excitons possess such extended lifetimes that, uncollected, they have the opportunity to undergo a wide variety of energy-level transitions, see for example [Y. Zhu, S. Cui, M. Liu, X. Liu, C. Lu, X. Xu, W. Xu, *Observation of Upconversion White Light and Ultrabroad Infrared Emission in $YbAG:Ln^{3+}$ (Ln=Nd, Sm, Tb, Er)*, Applied Physics Express 8 (2015) 072602], resulting in luminescence across a spectrum of energy levels that ultimately are dependent upon the precise composition and crystallite size and shape.

It is desirable to provide an improved device including a structure for broad spectrum radiation absorbing of rare earth in order to generate electrical potential.

SUMMARY OF THE INVENTION

In the present invention rare earth ion containing compounds, such as but not limited to lanthanide-doped crystallites, quantum-dots, or nanoparticles are intercalated within one-dimensional (1D) high-surface area semiconductor nanoarchitectures, such as assemblies or arrays of nanowires or nanotubes. The proximity of the exciton separation and transporting interface enables exciton tunneling through the electrically insulating layer that binds the rare earth ions, with their subsequent collection and transport to electrical contacts between which an electrical potential is created. In one embodiment of the present invention, an exciton scavenger device utilizes a semiconducting one-dimensional (1D) material nanoarchitecture, such as nanowire or nanotube arrays, into which broad spectrum radiation absorbing rare earth containing crystallites, quantum-dots, or nanoparticles are intercalated. The nanostructures can be about 1 nm to about 100 nm in diameter. The immediate proximity of the one dimensional (1D) nanostructures allows the radiation-generated excitons to tunnel through their electrically insulating 'cages' to rapidly reach the one dimensional (1D) material nanoarchitecture and from there passing to electrical contacts thereby generating an electrical potential.

The exciton scavenger device is composed of rare earth ion containing crystallites, quantum-dots, or nanoparticles, herein referred to as nanoparticles, having the ability to absorb broad spectrum radiation and, due to their extended exciton lifetimes, their intrinsically nonlinear UC/DC properties, intercalated within one dimensional (1D) material nanoarchitectures such as arrays of semiconducting nanowires or nanotubes. Intercalation of the rare earth based compounds within a material nanoarchitecture acts to quench the luminescent pathway, for the excitons generated by the absorbed radiation which are instead separated at the interface of the rare-earth based compounds and the one dimensional (1D) interface, ultimately passing through the interface to separate contacts between which an electrical potential is created. The exciton scavenger device can comprise a rare earth material, rare earth doped materials or combination thereof. The rare earth-doped materials can be selected for their luminesce properties. For example, the luminesce properties can be for several hours. Intercalated within a one dimensional (1D) exciton-transporting exciton scavenger architecture, excitons generated in the rare earth ion containing materials would, rather than being held in a meta-stable state for hours where they are free to undergo a host of energy transitions that ultimately lead to luminescence, be rapidly collected to generate an electrical potential. The invention will be more fully described by reference to the following drawings.

BRIEF DESCRIPTION OF THE DRAWINGS

FIG. 1 is schematic diagram of a exciton scavenger device in accordance with the teachings of the present invention.

FIGS. 2A-2C are images of $TiO_2$ nanotube arrays grown by anodization of Ti foil.

DETAILED DESCRIPTION OF THE INVENTION

Reference will now be made in greater detail to a preferred embodiment of the invention, an example of which is illustrated in the accompanying drawings. Wherever possible, the same reference numerals will be used throughout the drawings and the description to refer to the same or like parts.

Having summarized the invention, the invention may be further understood by reference to the following detailed description and non-limiting examples.

In the present invention excitons generated within a selected luminescent UC/DC material, nanoparticles containing rare earth ions, which possess extended lifetimes, can be collected before they undergo recombination transitions, and once collected readily transported to an electrical contact to create an electrical potential. It has been found that to achieve this, due to the electrically insulating 'cage' that surrounds the rare earth ions, such as oxygen atoms, for example, it is desirable to intercalate rare earth containing nanoparticles within a high-surface area one-dimensional (1D) exciton-transporting device geometry. In such a material architecture the rare earth ion generated excitons are never more than a few nanometers away from an exciton-separating interface, which in turn promotes exciton tunneling from the rare earth ion containing 'cages' to the inter-penetrating one dimensional (1D) material nanoarchitecture.

FIG. 1 is a schematic diagram of exciton scavenger device 10. One dimensional (1D) nanoarchitecture 11 comprises nanowire array 12. Nanowire array 12 comprises a plurality of nanowires 14. Nanowires 14 are intercalated with rare earth ion containing nanoparticles 13. Example nanoparticles 13 can include crystallites, quantum-dots, or nanoparticles. Spacing between nanowires 14 within nanowire array 12 can be less than 10 μm facilitating charge collection from the intercalated material of nanowires 14. The length of the nanowires 14 can range from nanometers to centimeters, with longer wires enabling the fabrication of correspondingly thicker exciton scavenger devices that allow for more complete absorption of incident radiation. In one embodiment, the length of nanowires 14 is in a range of about 10 nm to about 1000 mm. The diameter of nanowires 14 can be in the range of about 5 nm to about 35 nm. It has been found that an array of smaller diameter wires results in higher interfacial surface area, however unless single crystal smaller diameter wires will be of higher electrical resistance. It will be appreciated that in accordance with the teachings of the present invention nanowires 14 can have various shapes including nanorods, nanotubes or other shapes such as for example nanofeathers or elongated ellipses. Nanoarchitecture 11 can be an or disordered, randomly oriented array of features selected from various shapes such as for example. nanowires, nanorods, nanotubes and nanofeathers or a mesoporous aggregate of the features.

Nanowires 14 can be grown from surface 16. For example, surface 16 can be a Ti foil. Excitons from nanowires 14 can be received at electrical contact 20. The small wire-to-wire spacing and the long exciton lifetimes, on the order of milliseconds, enables the excitons to tunnel through the electrically insulating 'cage' to reach nanowires 14, where they are then transferred to electrical contact 20.

In FIG. 1, the wire composition of nanowires 14 chosen for the example is $TiO_2$, an electron-transporting n-type semiconductor. In operation of exciton scavenger device 10, the excitons generated by rare earth containing ions in rare earth containing nanoparticles 13 will tunnel through the electrically insulating cage, that is but a few atomic layers thick, to reach nanowire 14, travel down nanowire 14 to electrical contact 20, while the absence or need of an exciton will travel in the opposite direction to electrical contact 22. Electrical contact 20 and electrical contact 22 can comprise a metal. Example metals include aluminum, copper, zinc, gold, tin, silver, platinum, and alloys thereof. The rare earth ions can be bound within an organic host matrix comprising organic ligands bearing aromatic chromophores. The rare earth ions can be bound within an inorganic host matrix, the matrix being comprised of halides, oxides, oxyhalides, or oxysulfides. Radiation absorbed by the rare earth ion containing material can possess a wavelength from between 0.01 μm and 300 cm. Rare earth ions can be comprised of one or more of the following elements: lanthanum, cerium, praseodymium, neodymium, promethium, samarium, europium, gadolinium, terbium, dysprosium, holmium, erbium, thulium, ytterbium, lutetium, scandium, or yttrium. Rare earth ion containing material can be tuned to achieve either broad spectrum radiation absorption, the absorption of a specific wavelength, or the absorption of a specific band of wavelengths. Charge generation capabilities of the rare earth ion containing material can be adjusted through appropriate elemental doping. The rare earth ion containing material can contain one or more nonmetals selected from the group consisting of B, C, K, Ca, Na, F, I, P, S and mixtures The rare earth ion containing crystallites, quantum-dots, or nanoparticles can include one or more co-catalysts which are deposited on one or more surfaces of the device wherein the co-catalyst is selected from the group consisting of graphene, boron nitride, Ag, As, Au, Bi, Cd, Co, Cu, CuO, $Cu_2O$, Fe, Ga, Ge, In, Ir, Ni, Pb, Pd, Pt, Rh, Sb, Si, Sn, Ta, Tl, W, Zn and mixtures thereof. The rare earth ion containing crystallites, quantum-dots, and/or nanoparticles can be in contact with graphene or boron nitride, by which charge separation is facilitated. It is recognized in accordance with the teachings of the present invention that the exciton-transferring properties of the rare earth ion containing materials can be tailored, as necessary, through material composition and synthesis technique. So too the propensity of the charges to leave the 'caged' rare earth ions for that of the one dimensional (1D) charge transporting architecture can be adjusted through composition of either one dimensional (1D) nanoarchitecture 11, or the rare earth ion containing nanoparticles 13. The one dimensional (1D) nanoarchitecture 11 can be composed of any semiconductor material including for example, silicon, zinc oxide, tin oxide, niobium oxide, vanadium oxide, copper oxide, titanium oxide, GaN, GaAs, gadolinium phosphide, tungsten oxide, tantalum, strontium oxide and iron oxide. The composition of one dimensional (1D) nanoarchitecture 11 can be chosen to best match that of the rare earth ion containing nanoparticles 13 to ensure maximum radiation absorption and exciton collection. For example, nanowires 12 can be $TiO_2$ nanowires.

The interpenetrating one dimensional (1D) nanoarchitecture 11 is vital to operation of exciton scavenger device 10 operation as the directions of exciton separation and radiation absorption are generally orthogonalized. While excitons are collected across a distance of but a few tens of nanometers, the length or thickness of one dimensional (1D) nanoarchitecture 11, be it wires or tubes or other shapes such as feathers or elongated ellipses, into which the rare earth ion containing nanoparticles 13 are intercalated, can range from microns to tens of mm in length allowing for greater absorption of incident radiation.

Exciton scavenger device 10 can include any suitably rare earth ion containing nanoparticle 14 enclosed within an electrically insulating shell 15. There is considerable flexibility to the one-dimensional exciton collecting and transporting architectures that might be used in exciton scavenger device 10, both in the geometrical features, be they wires, tubes, rods, feather-shaped, plate-shaped and the like, and in their semiconducting properties, either n-type or p-type, and of any general semiconductor compositions, for example silicon, GaN, GaAs, gadolinium phosphide, tungsten oxide, tantalum oxide, zinc oxide, titanium oxide, copper oxide, strontium oxide, iron oxide, and the like. Given a specific radiation absorbing exciton generating rare earth ion containing nanoparticle 13, the composition of the intercalating one dimensional (1D) charge transporting architecture can be chosen to provide optimal power conversion efficiency. Energy of excitons not collected by the one dimensional (1D) nanoarchitecture 11 can act to thermally heat exciton scavenger device 10, resulting in infrared radiation which is absorbed by another region of exciton scavenger device 10, and the absorbed radiation in turn generating excitons.

FIGS. 2A-2C illustrate $TiO_2$ nanotube array films made by anodization of Ti foil in a fluorine-containing electrolyte, which are an illustrative example of a 1D material nanoarchitecture suitable for use within an exciton scavenger device 12. With respect to the nanotubes, using sol gel techniques, for example, or an electrodeposition technique, or a hydrothermal technique, and the like, the tubes can be readily intercalated with rare earth luminescent materials; the nanoscale 1D geometry is such that charges generated within the up-conversion (UC) material have only to travel a few nm to reach a nanotube wall. Ordered and dis-ordered arrays of nanoscale architectures such as wires or tubes, feather-like structures, disks, plates, and the like, can be utilized in the exciton scavenger device 10; the specific shapes can vary so long as the overall nanoscale architecture is one of high surface area, readily admits intercalation of the rare earth ion containing nanoparticles, and supports rapid charge transfer. The work functions of the intercalated materials can be aligned such that excitons travel from the rare earth ion containing nanoparticles into the 1D material nanoarchitecture, and not vice versa. FIGS. 2A and 2B illustrate an ordered array of nanotubes. FIG. 2C illustrates a dis-ordered array of nanotubes. Crystallinity of components of exciton scavenger device 10 can be improved by exposure to an annealing step.

Exciton scavenger device 10 absorbs broad spectrum radiation. It will be appreciated that should specific application be made to wavelengths below the visible spectrum, such as infrared, millimeter waves, or microwaves, exciton scavenger device 10 need not be made optically transparent and can be built upon optically opaque substrates. Example opaque substrates include metal foils, plastic ribbons, semiconductor disks or platters, and the like.

While the specific compositions can be varied, the advantageous subject of this invention, is the intercalation of rare earth ion containing nanoparticles, materials recognized as luminescent, within a one dimensional (1D) semiconductor material nanoarchitecture so that the radiation generated excitons, bound within their electrically insulating shell left to recombine and thus luminesce, are collected to generate an electrical potential.

The rare earth ion containing nanoparticles can be synthesized using a variety of techniques, for example sol-gel, electrodeposition, microemulsion, atomic layer deposition, hydrothermal synthesis, microwave-assisted hydrothermal synthesis, dip-coating, and the like It is to be understood that the above-described exciton scavenger device embodiments are illustrative of only a few of the many possible specific embodiments, based upon the intrinsic coupling of rare earth ion-based luminescent materials, that is rare earth ions bound by an electrically insulating shell, with an exciton transporting one dimensional (1D) semiconductor nanoarchitecture used to collect and transport the radiation generated excitons. Numerous and varied rare earth-based material compositions (composition, crystallinity, structure), and numerous one dimensional (1D) material architectures (composition, crystallinity, structure) can be readily devised in accordance with the teachings of the present which are to be considered within the spirit and scope of the invention.

What is claimed is:

1. An exciton scavenger device for conversion of electromagnetic radiation into an electrical potential, comprising:
a rare earth ion containing material, the rare earth ion containing material comprising rare earth ions within crystallites, quantum-dots, and/or nanoparticles, the rare earth ions electronically insulated sufficiently to allow upconversion, wherein a radiation absorbed by the rare earth ion containing material possesses a wavelength from between 0.01 µm and 300 cm;
the rare earth ion containing material is intercalated within a one-dimensional (1D) nanoarchitecture; and
an electrical contact,
wherein the one-dimensional (1D) nanoarchitecture is an ordered or disordered array of one or more exciton-transporting architectural features, the architectural features selected from nanowires, nanotubes, nanorods, and nanofeathers, and wherein the one-dimensional (1D) nanoarchitecture serves to collect excitons generated within the rare earth ions and subsequently transport the excitons to a first electrical contact.

2. The exciton scavenger device of claim 1 wherein the rare earth ions are bound within an organic host matrix comprising organic ligands bearing aromatic chromophores.

3. The exciton scavenger device of claim 1 wherein the rare earth ions are bound within an inorganic host matrix, the matrix being comprised of halides, oxides, oxyhalides, or oxysulfides.

4. The exciton scavenger device of claim 1 wherein the rare earth ion containing material is connected to a second electrical contact, the first and second electrical contacts comprising a metal, selected from aluminum, copper, zinc, gold, tin, silver, and platinum, and alloys thereof, wherein an electrical potential is created between the first electrical contact and the second electrical contact.

5. The exciton scavenger device of claim 1 wherein the rare earth ions within the crystallites, quantum-dots, and/or nanoparticles are comprised of one or more of the following elements: Lanthanum, cerium, praseodymium, neodymium, promethium, samarium, europium, gadolinium, terbium, dysprosium, holmium, erbium, thulium, ytterbium, lutetium, scandium, or yttrium.

6. The exciton scavenger device of claim 1 wherein the rare earth ion containing material is tuned to achieve either broad spectrum radiation absorption, the absorption of a specific wavelength, or the absorption of a specific band of wavelengths.

7. The exciton scavenger device of claim 1 wherein the one-dimensional (1D) nanoarchitecture is a disordered, randomly oriented array of one or more architectural features, the architectural features selected from nanowires, nanotubes, nanorods, or nanofeathers.

8. The exciton scavenger device of claim 1 wherein the one-dimensional (1D) nanoarchitecture comprises a plurality of elements, the elements being selected from nanowires, nanorods, nanotubes or nanofeathers, having a spacing between the elements less than 10 µm.

9. The exciton scavenger device of claim 1 wherein the one-dimensional (1D) nanoarchitecture comprises a plurality of elements, the plurality of elements selected from nanowires, nanotubes, nanofeathers, the plurality of elements having a length of more than about 10 nm and less than about 1000 mm.

10. The exciton scavenger device of claim 1 wherein the one-dimensional (1D) nanoarchitecture is made of a semiconductor, the semiconductor is a p-type or n-type.

11. The exciton scavenger device of claim 1 wherein charge generation capabilities of the rare earth ion containing material is adjusted through appropriate elemental doping.

12. The exciton scavenger device of claim 1 wherein the rare earth ion containing material contains one or more nonmetals selected from the group consisting of B, C, K, Ca, Na, F, I, P, S and mixtures thereof.

13. The exciton scavenger device of claim 1 wherein the rare earth ion containing material are intercalated within the one-dimensional (1D) nanoarchitecture using sol-gel, potential-assisted sol-gel, electrodeposition, photodeposition, centrifuge-assisted deposition, microemulsion, spin-coating, atomic layer deposition, hydrothermal synthesis, microwave-assisted hydrothermal synthesis, or dip-coating techniques.

14. The exciton scavenger device of claim 1 wherein the crystallites, quantum-dots, or nanoparticles include one or more co-catalysts which are deposited on one or more surfaces of the excitation scavenger device wherein the co-catalyst is selected from the group consisting of graphene, boron nitride, Ag, As, Au, Bi, Cd, Co, Cu, CuO, $Cu_2O$, Fe, Ga, Ge, In, Ir, Ni, Pb, Pd, Pt, Rh, Sb, Si, Sn, Ta, TI, W, Zn and mixtures thereof.

15. The exciton scavenger device of claim 1 wherein the rare earth ions within crystallites, quantum-dots, and/or nanoparticles are in contact with graphene or boron nitride, by which charge separation is facilitated.

16. The exciton scavenger device of claim 1 wherein crystallinity of the exciton scavenger device is improved by exposure to an annealing step.

17. The exciton scavenger device of claim 1 wherein an underlying substrate of the one-dimensional (1D) nanoarchitecture is a conductor.

18. The exciton scavenger device of claim 1 wherein energy of excitons not collected by the one-dimensional (1D) nanoarchitecture act to thermally heat the device, resulting in infrared radiation which is absorbed by another region of the exciton scavenger device, and the absorbed radiation in turn generating excitons.

* * * * *